United States Patent [19]

D'Anna

[11] Patent Number: 6,064,088
[45] Date of Patent: May 16, 2000

[54] RF POWER MOSFET DEVICE WITH EXTENDED LINEAR REGION OF TRANSCONDUCTANCE CHARACTERISTIC AT LOW DRAIN CURRENT

[75] Inventor: Pablo Eugenio D'Anna, Los Altos, Calif.

[73] Assignee: Xemod, Inc., Santa Clara, Calif.

[21] Appl. No.: 09/097,532

[22] Filed: Jun. 15, 1998

[51] Int. Cl.[7] .......................... H01L 29/76; H01L 29/94; H01L 31/062; H01L 31/113; H01L 31/119
[52] U.S. Cl. ........................................... 257/341; 257/383
[58] Field of Search .................. 257/343, 355, 257/341, 383

[56] References Cited

U.S. PATENT DOCUMENTS 5,155,563  10/1992  Davies et al. ........................ 357/23.4
5,900,663  5/1999  Johnson et al. ........................ 257/343

FOREIGN PATENT DOCUMENTS 4-340736  11/1992  Japan ........................................ 257/344

*Primary Examiner*—Sheila V. Clark
*Attorney, Agent, or Firm*—Boris G. Tankhilevich

[57] ABSTRACT

A semiconductor MOSFET device having a decreased length of the channel region is disclosed. In one embodiment of the device, each gate includes three gate subregions. An enhancement drift drain region underlies the first gate subregion, a channel region underlies the third gate subregion, and each enhancement drift drain region and each channel region are separated by an epitaxial region underlying the second gate subregion. The device of the present invention if used as an amplifier, has a more linear transfer characteristic, less cross talk and less channel interference than a conventional semiconductor MOSFET device having a conventional gate region without gate subregions.

7 Claims, 4 Drawing Sheets

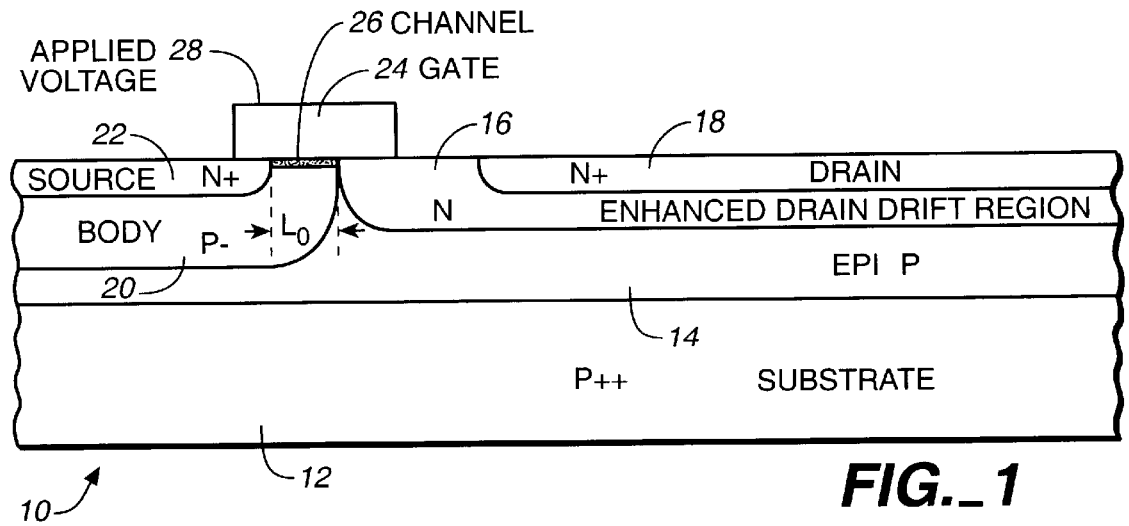
FIG._1
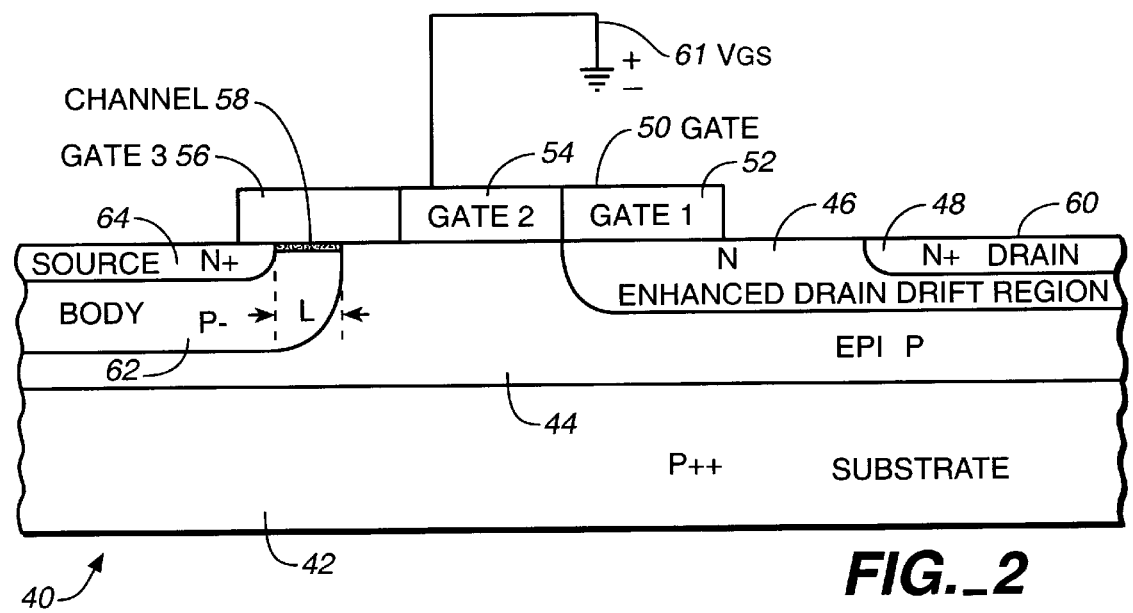
FIG._2
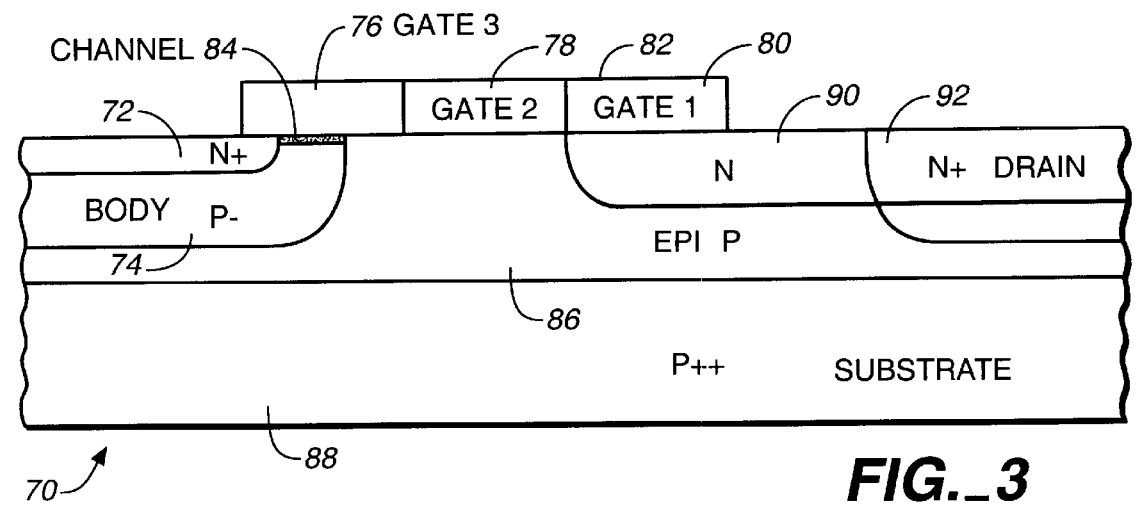
FIG._3

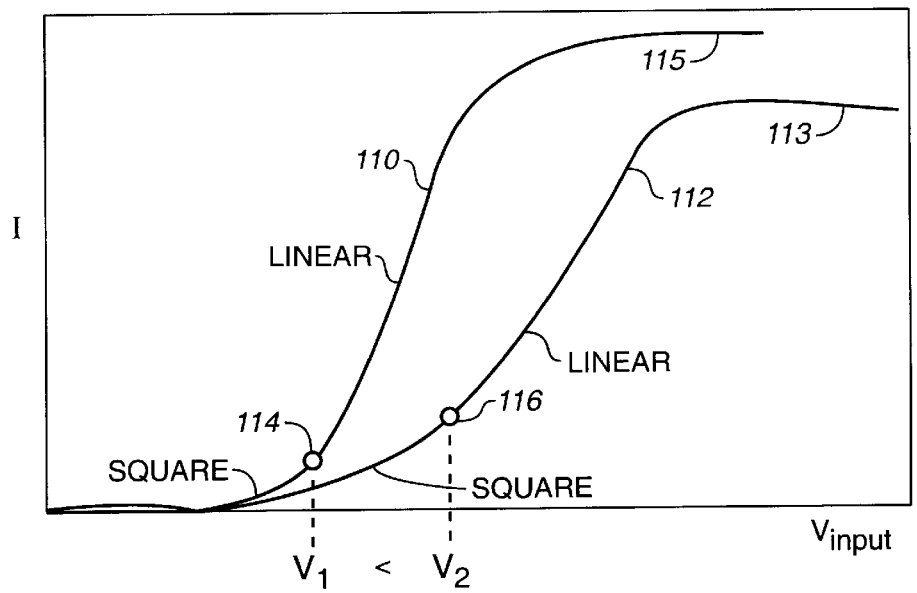
FIG._4
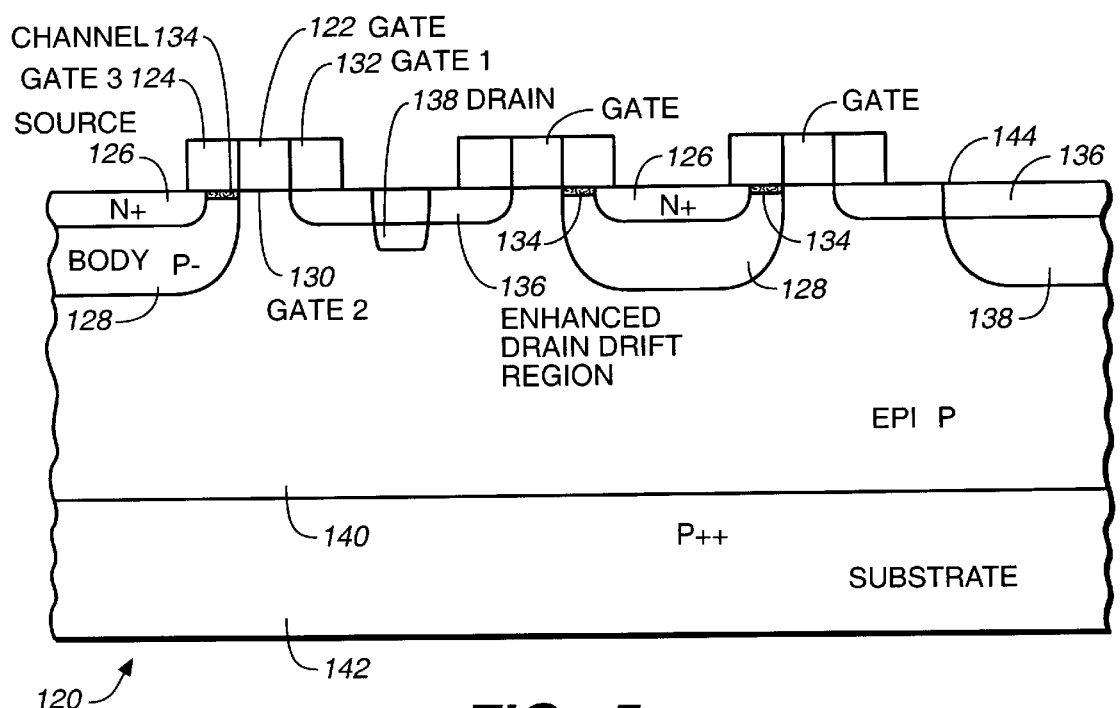
FIG._5

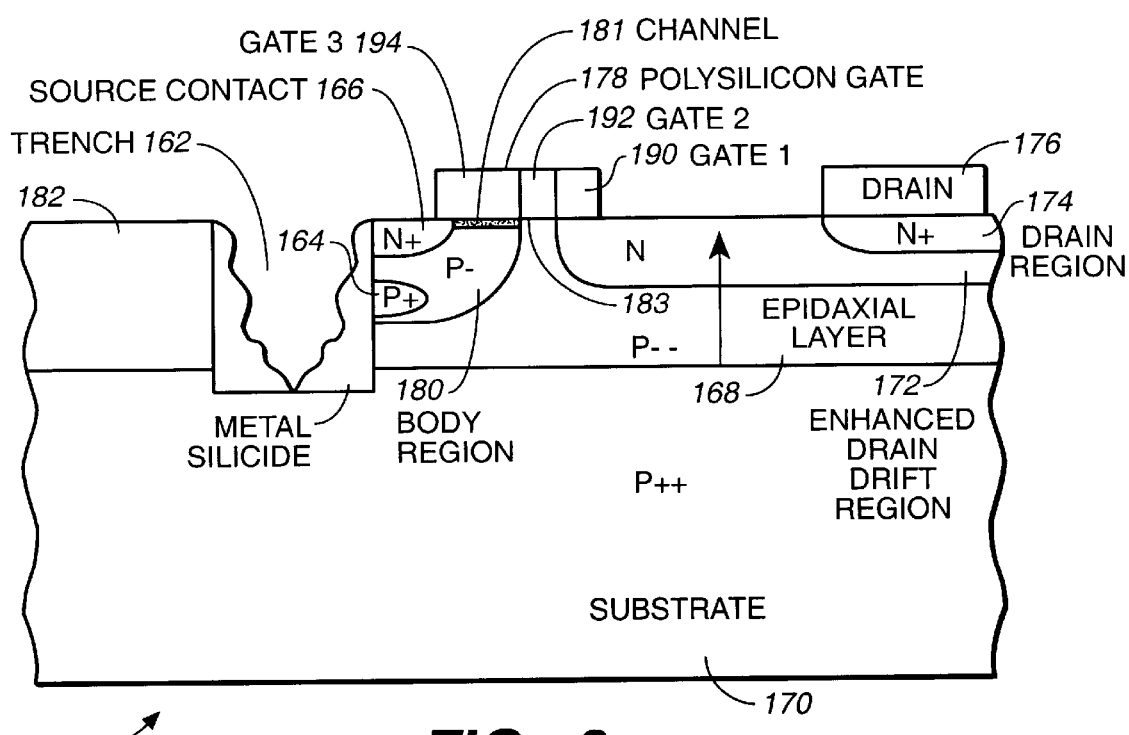
FIG._6

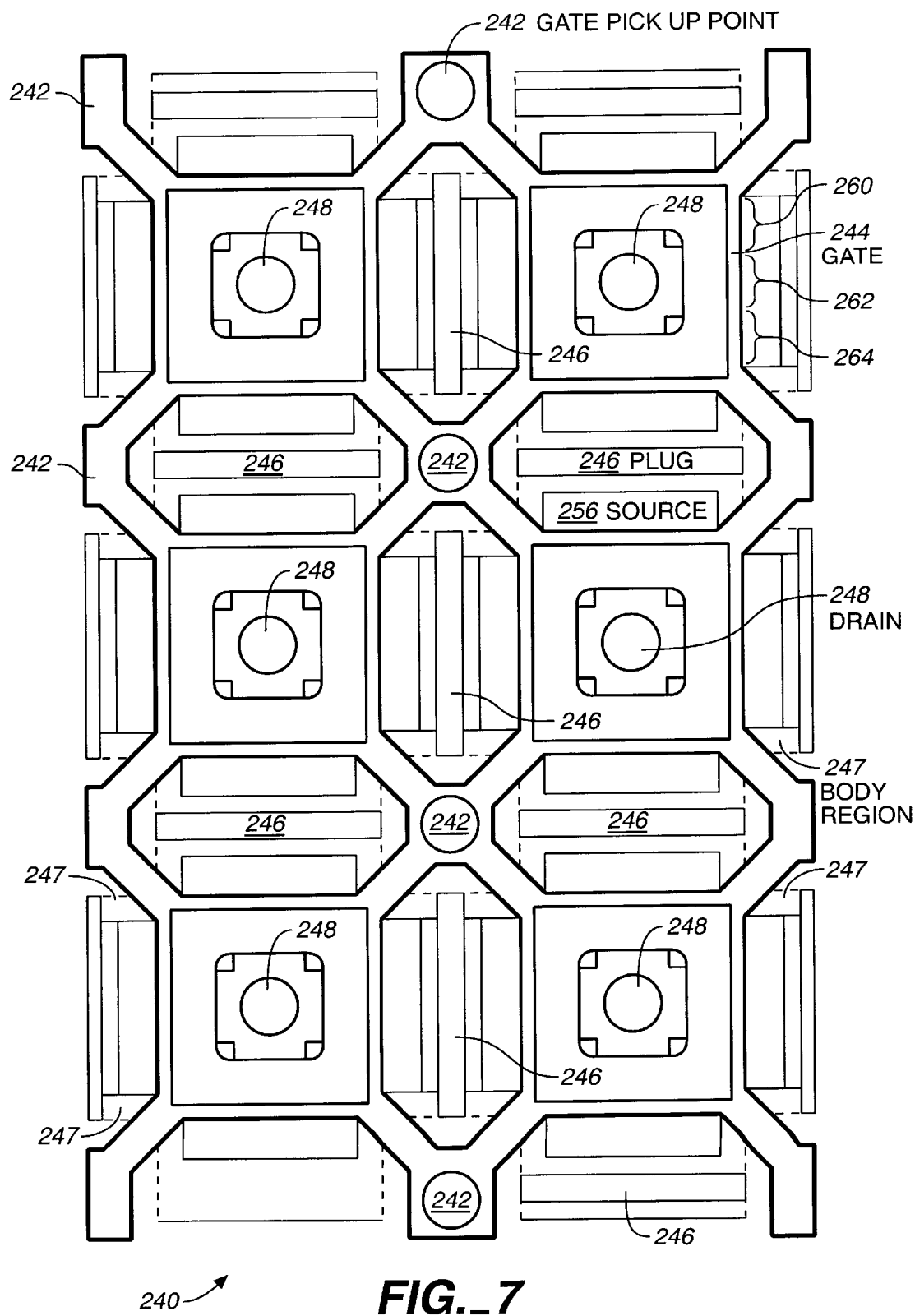
FIG._7

RF POWER MOSFET DEVICE WITH EXTENDED LINEAR REGION OF TRANSCONDUCTANCE CHARACTERISTIC AT LOW DRAIN CURRENT

BACKGROUND

A typical field effect transistor (MOSFET) is used nowadays instead of a bipolar transistor at high frequencies (1–2) GHz in cellular and personal communication services (PCS) wireless communication amplifiers.

One reason for the preference for a MOSFET device over a bipolar device is that a MOSFET device is a more linear device, that is it has a less non-linear transfer characteristic, than a bipolar device.

Indeed, each P-N junction has a non-linear transfer characteristic. A typical bipolar device has two P-N junctions and is an inherently non-linear device with an exponential transfer characteristic.

On the other hand, a typical MOSFET transistor, though it nominally has also two P-N junctions, can be modelled by a resistor whose conductivity is modulated by changes in gate voltage. It follows, that a MOSFET transistor is in a sense a less non-linear device than a bipolar transistor.

A typical MOSFET transistor has a gate-voltage-to-drain-current transfer characteristic that can be approximated by a parabolic function at small gate voltages and by a linear function at intermediate gate voltages. At large gate voltages, the transfer characteristic of a typical MOSFET device becomes saturated.

The high-efficiency power amplifiers used in cellular and PCS infrastructure are biased class AB or B. This means that the DC bias point is located in the low current portion of the transfer curve. Therefore, most of the distortion produced by the device comes from operating the device in the low current portion area of the transfer characteristic.

What is needed is an RF MOSFET device with a reduced parabolic and an extended linear portions of the transconductance curve at low currents so that the RF MOSFET device has less intermodulation and crosstalk distortion when it is used in a power amplifier for wireless communications.

SUMMARY

The present invention is unique because it discloses an RF MOSFET device with a reduced parabolic and an extended linear portions of the transconductance curve at low currents.

In one embodiment, a semiconductor device of the present invention includes an element comprising: (a) a substrate; (b) an epitaxial layer; (c) a conductive gate region further comprising a first gate region, a second gate region, and a third gate region; (d) an enhanced drain drift region underlying the first gate region; (e) a drain region contacting the enhanced drain drift region; (f) a body region further including a channel region underlying the third gate region, wherein the enhanced drain drift region and the channel region are separated; and (g) a source region located within the body region.

In this embodiment, the semiconductor device in its entirety comprises: (a) a substrate; (b) an epitaxial layer; (c) a plurality of gate regions, each gate region further comprising a first gate region, a second gate region, and a third gate region; (d) a plurality of enhanced drain drift regions, each enhanced drain drift region underlying one first gate region; (e) a plurality of drain regions, each drain region contacting one enhanced drain drift region; (f) a plurality of body regions, each the body region further including a channel region underlying one third gate region, wherein each enhanced drain drift region and each channel region are separated; (g) a plurality of source regions, each fourth region being located within one third region; and (h) a single level of metal on the top surface of the epitaxial layer utilized to connect each source region, each drain region, and each gate region.

In another embodiment, a semiconductor device of the present invention comprises a lateral RF MOS transistor having a plug connective structure.

In this embodiment, the lateral RF MOS transistor having a plug connective structure comprises an element including: (a) a semiconductor material; (b) a conductive gate further comprising a first gate region, a second gate region, and a third gate region; (c) an enhanced drain drift region the first gate region; (d) a drain region contacting the first region; (e) a body region further including a channel region underlying the third gate region, wherein the enhanced drain drift region and the channel region are separated; (f) a source region located within the third region; (g) a body contact enhancement region located within the body region; and (h) a conductive plug region formed in the source region and in the body region of the semiconductor material.

In this embodiment, the lateral RF MOS transistor in its entirety comprises a quasi-mesh gate structure including: (a) a semiconductor material; (b) a plurality of conductive gates, each gate further comprising a first gate region, a second gate region, and a third gate region; (c) a plurality of enhanced drain drift regions, each enhanced drain drift region underlying one first gate region; (d) a plurality of drain regions, each drain region contacting one enhancement drain drift region; (e) a plurality of body regions, each body region including a channel region, wherein each enhanced drain drift region and each channel region are separate; (f) a plurality of source regions, each fourth region located within one body region; (g) a plurality of body contact regions, each body contact region located within one body region; (h) a plurality of conductive plug regions, each conductive plug region being used to connect one source region and one body region to a backside of the lateral RF MOS transistor; (i) a layer of an insulator including a first plurality of openings used to expose each gate region, and including a second plurality of openings used to expose each drain region; (k) a first plurality of metal fingers used to connect each exposed drain region to a first side of the RF MOS transistor; and (1) a second plurality of metal fingers used to connect each exposed gate region to a second side of the RF MOS transistor.

BRIEF DESCRIPTION OF THE DRAWINGS

FIG. 1 depicts an element of a conventional MOSFET transistor.

FIG. 2 shows one embodiment of a semiconductor device of the present invention wherein the drain region is located completely within the enhanced drain drift region.

FIG. 3 illustrates another embodiment of a semiconductor device of the present invention wherein the drain region is located laterally within the enhanced drain drift region.

FIG. 4 depicts the transfer characteristics for the device of the present invention (with gap) and for the conventional device (with no gap).

FIG. 5 shows a semiconductor device of the present invention that includes a plurality of elements depicted in FIG. 4.

FIG. 6 illustrates a lateral RF MOS device having a plug connective structure between the source and the backside and having a reduced length of the channel region.

FIG. 7 depicts a quasi-mesh structure for a lateral RF MOS device having a plug connective structure between the source and the backside and having a reduced length of the channel region.

FULL DESCRIPTION OF THE PREFERRED EMBODIMENTS.

FIG. 1 depicts an element (10) of a conventional MOSFET transistor. It includes a substrate (12), an epitaxial layer (14), an enhanced drain region (16), a drain region (18), a body region (20), a source region (22), a gate (24), and a channel region (26). The MOSFET device includes a plurality of elements (10) of FIG. 1.

If a positive gate voltage (28) is applied to the gate (24) of the channel region (26), this channel region changes its polarity from P to N. Hence, the carriers can drift from the N source region (22) to the N drain region (18). Therefore, the resistance of the channel (26) can be modulated by a positive gate voltage.

A gate-voltage-to-drain-current transfer characteristic of the structure (10) can be approximated by a parabolic function at small gate voltages and by a linear function at intermediate gate voltages. At large gate voltages, the transfer characteristic of a typical MOSFET device becomes saturated.

The present invention discloses a semiconductor device (40) of FIG. 2 that has a transconductance characteristic with a significantly increased linear region at low drain current.

In one embodiment, an epitaxial layer (44) of the first (P) conductivity type is deposited on a substrate (42) of the same (P) first conductivity type.

In another embodiment, the epitaxial layer (44) of a second (N) conductivity type is deposited on a substrate (42) of the same (N) second conductivity type.

The epitaxial layer (44) has the first dopant concentration (P in one embodiment) and a top surface (60).

A conductive gate region (50 of FIG. 2) is insulated from the top surface (60) of the epitaxial layer (44) by a layer of silicon oxide (not shown).

In the semiconductor device (40) of the present invention, the gate region (50) further comprises three gate regions: a first gate region (52), a second gate region (54), and a third gate region (56).

In one embodiment, a body region (62) is of the first (P) conductivity type and having a dopant concentration (P$^-$) can be formed in the epitaxial layer (44) of the same first (P) conductivity type.

In another embodiment, the body region (62) is of the second (N) conductivity type and having a dopant concentration (N$^+$) can be formed in the epitaxial layer (44) of the same first (N) conductivity type.

In one embodiment, the body region (62) is more heavily doped than the epitaxial layer (44).

In one embodiment, an enhanced drain drift region (46) of a second (N) conductivity type underlying the first gate region (52) can be formed completely within the epitaxial layer (44) of the first (P) conductivity type.

In another embodiment, an enhanced drain drift region (46) of the first (P) conductivity type underlying the first gate region (52) can be formed completely within the epitaxial layer (44) of the second (N) conductivity type.

In one embodiment, a drain region (48) of a second (N) conductivity type can be formed in the epitaxial layer (44). In this embodiment, the drain region (48) has a dopant concentration N$^+$ that is greater than the N dopant concentration of the enhanced drain drift region (46).

In another embodiment, a drain region (48) of the first (P) conductivity type can be formed in the epitaxial layer (44). In this embodiment, the drain region (48) has a dopant concentration (P$^-$) that is greater than the (P) dopant concentration of the enhanced drain drift region (46).

In one embodiment, as shown in FIG. 2, the drain region (48) is located completely within the enhanced drift drain region (46).

In another embodiment, as shown in FIG. 3, the drain region (92) is located only laterally within the enhanced drift drain region (90).

In one embodiment, a source region (64 of FIG. 2) of the second (N) conductivity type having an (N$^+$) dopant concentration can be formed in the P epitaxial layer (44).

In another embodiment, a source region (64 of FIG. 2) of the first (P) conductivity type having a (P$^-$) dopant concentration can be formed in the N epitaxial layer (44).

In one embodiment, the drain region (48) and the source region (64) are equally doped.

In one embodiment, the source region (64) is formed within the body region (62).

In the semiconductor device (40) of the present invention, as shown in FIG. 2, the channel region (58) formed in the body region (62) underlies only a part of the gate (50), namely the third gate region (56).

As discussed below, one can increase the linear region of the transconductance of the MOSFET semiconductor device (40) by decreasing the length L of the channel (58) as compared with the length L$_0$ of the channel (26) in the conventional semiconductor device (10) of FIG. 1.

The length of the gate (50) in the semiconductor device (40) of FIG. 2 is limited by the technology that is utilized in its fabrication.

In the power RF technology that is currently used (photolithography, etching, etc) to produce device for the wireless base station market the length of the gate is approximately 1μ.

But given the length of the gate, one can still choose the length L of the channel (58).

In the conventional semiconductor device as shown in FIG. 1, the length L$_0$ of the channel (26) is also approximately 1μ.

However, in the semiconductor device (40 of FIG. 2) of the present invention, the length L of the channel (58) is determined by the length of the third gate region (56) which can be significantly smaller than the length of the gate (50).

In addition, in the device (40) of the present invention, the enhanced drain drift region (46) and the channel region (58) are separated by the portion of the epitaxial layer underlying the second gate region (54).

If one compares the device (40 of FIG. 2) of the present invention with the conventional device (10 of FIG. 1), one can see that in the device (40) of the present invention there is a gap between the channel region and the enhanced drain drift region that the majority carriers (holes in one embodiment, or electrons in another embodiment) have to overcome.

The transfer characteristic of the MOSFET device, as shown in FIG. 4, includes three parts: the parabolic part, the linear part, and the saturation part. For the device of the present invention the transfer characteristic (110) is linear over a wider range of gate voltage as opposed to the transfer characteristic (112) of the conventional MOSFET device.

Thus, the transfer characteristic of the MOSFET device can be improved by introducing a gap between the channel region and the enhanced drain drift region.

The minimum length L of the channel region (58 of FIG. 2) is determined by the value of the drain-source voltage of the device (40).

FIG. 5 depicts a semiconductor device (120) of the present invention that includes a plurality of elements (70) of FIG. 3.

In one embodiment, an epitaxial layer (140) of the first (P) conductivity type is deposited on a substrate (142) of the same (P) first conductivity type.

In another embodiment, the epitaxial layer (140) of the second (N) conductivity type is deposited on the substrate (142) of the same (N) second conductivity type.

The epitaxial layer (140) has a first dopant concentration (P in one embodiment) and a top surface (144).

A plurality of gate regions (122) are insulated from the top surface (144) of the epitaxial layer (140) by the thin layer of silicon dioxide.

Each gate (122) further comprises a first gate region (124), a second gate region (130), and a third gate region (132).

A plurality of enhanced drain drift regions (136) placed back-to-back are formed completely within the epitaxial layer (140).

In one embodiment, each enhanced drain drift region is of the second (N) conductivity type, if the epitaxial layer (140) is of the first (P) conductivity type.

In another embodiment, each enhanced drain drift region is of the first (P) conductivity type, if the epitaxial layer (140) is of the second (N) conductivity type.

Each enhanced drain drift region (136) underlies one first gate region (132).

A plurality of drain regions (138) placed back-to-back are formed completely within the epitaxial layer (140).

In one embodiment, each drain region (138) is of the second (N) conductivity type, if the epitaxial layer (140) is of the first (P) conductivity type.

In another embodiment, each drain region (138) is of the first (P) conductivity type, if the epitaxial layer (140) is of the second (N) conductivity type.

Each drain region contacts one enhanced drain drift region.

In one embodiment, each drain region is located laterally within enhancement drain drift region as shown in FIG. 5.

In another embodiment, each drain region is located completely within enhancement drain drift region (not shown).

A plurality of body regions (128) placed back-to-back are formed completely within the epitaxial layer (140).

In one embodiment, each body region (128) is of the first (P) conductivity type, if the epitaxial layer (140) is of the first (P) conductivity type.

In another embodiment, each body region (128) is of the second (N) conductivity type, if the epitaxial layer (140) is of the second (N) conductivity type.

Each body region (128) further includes a channel region (134) formed in the body region when a voltage is applied to the semiconductor device.

Each channel region (134) underlies one third gate region (124). Each enhanced drain drift region (136) and each channel region (134) are separated by the portion of the epitaxial layer underneath the second gate region (130).

Finally, a plurality of source regions (126) placed back-to-back are formed completely within the epitaxial layer (140).

In one embodiment, each source region (126) is of the of the second (N) conductivity type, if the epitaxial layer (140) is of the first (P) conductivity type.

In another embodiment, each source region (128) is of the first (P) conductivity type, if the epitaxial layer (140) is of the second (N) conductivity type.

In one embodiment, each source region (126) is located within one body region (128).

In one embodiment, each source region (126) has the same dopant concentration as the drain region (138).

A single level of metal (not shown) can be utilized to connect each source region (126), each drain region (138), and each gate region (122) of the semiconductor device (120 of FIG. 5).

In the U.S. patent application Ser. No. 09/020,257, filed on Feb 7, 1998, the lateral RF MOS device (160), as depicted in FIG. 6, having a plug connective structure between the source and the backside, was disclosed. This patent application is incorporated hereby in its entirety by reference.

FIG. 6 depicts a detailed cross-sectional view of the lateral RF MOS transistor having a plug source-body-contact structure. The device structure (160) comprises: a semiconductor material comprising an epitaxial layer (168), a conductive gate (178), an enhanced drain drift region (172), a drain region (174), and a body region of the RF MOS structure (180).

The body region (180) further includes a channel region (181) underlying the conductive gate (178), a source contact region (166), and a body contact region (164).

A conductive plug region (162) connects the source region (166) and the body contact region (164) of the semiconductor material to a backside of the RF MOS structure.

In another embodiment of the present invention, a lateral RF MOS transistor having a plug connective structure (160 of FIG. 6) includes a gate region (178) further comprising three gate regions: a first gate region (190), a second gate region (192), and a third gate region (194).

In this embodiment of the present invention, the channel region (181) underlies the third gate region, the enhancement drain drift region underlies the first gate region, and the channel region and the enhancement drain drift region are separated by a part of the epitaxial layer underlying the second gate region.

In this embodiment, the length of the channel region is smaller than the length of the gate (178). As was explained above, this kind of gate structure results in a RF MOS device having an extended linear region of transconductance characteristic at low drain current.

In the U.S. patent application Ser. No. 09/020,256, filed on Feb 7, 1998, a quasi-mesh structure for a lateral RF MOS device (240), as depicted in FIG. 7, having a plug connective structure between the source and the backside, was disclosed. This patent application is incorporated hereby in its entirety by reference.

FIG. 7 illustrates a top view of the quasi-mesh gate structure (240) showing a plurality of drain regions (248), a plurality of source regions (250) including a plurality of conductive plugs (246), a plurality of separate portions of a conductive gate (244) connected to a plurality of gate pick up points (242), and a plurality of body regions (247).

The top view of the quasi-mesh gate structure, as depicted in FIG. 9, shows that a conductive gate of the whole device includes a plurality of substantially identical gate sites (244).

In one embodiment, as shown in FIG. 7, each substantially identical gate site can approximate a square shape, and each substantially identical drain site can approximate a square shape.

Thus, the quasi-mesh gate structure (240 of FIG. 7) results in a dense array of sources, gate loops, and drain regions.

In one more embodiment of the present invention, the quasi-mesh gate structure (240) of FIG. 7 further includes a plurality of gate regions, wherein each gate region (244) further comprising three gate regions: a first gate region (260), a second gate region (262), and a third gate region (264).

In this embodiment of the present invention, each channel region underlies one third gate region, each enhancement drain drift region underlies one first gate region, and each channel region and each enhancement drain drift region are separated by a part of the epitaxial layer underlying one second gate region.

Thus, in this embodiment, the length of the channel region is smaller than the length of the gate (178). As was explained above, this kind of gate structure results in a RF MOS device with a quasi-mesh gate structure having an extended linear region of transconductance charteristic at low drain current.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A lateral RF MOS transistor having a plug connective structure comprising:

a semiconductor material of a first conductivity type, said semiconductor material having a first dopant concentration and a top surface;

a conductive gate overlying and insulated from said top surface of said semiconductor material, said gate further comprising:
a first gate region;
a second gate region; and
a third gate region;

a first region formed completely within said semiconductor material of said first conductivity type, said first region being of a second conductivity type and having a second dopant concentration to form an enhanced drain drift region of said RF MOS transistor structure, said enhanced drain drift region underlying said first gate region;

a second region formed in said semiconductor material, said second region being of said second conductivity type and having a third dopant concentration greater than said second dopant concentration to form a drain region of said RF MOS transistor, said second region contacting said first region;

a third region formed in said semiconductor material, said third region being of said first conductivity type and having a fourth dopant concentration to form a body region of said RF MOS transistor structure, said fourth dopant concentration being equal or greater than said first dopant concentration, said body region further including:
a channel region formed in said body region when a voltage is applied to said gate, said channel region underlying said third gate region;

a fourth region formed in said semiconductor material, said fourth region being of said second conductivity type and having a fifth dopant concentration to form a source region of said RF MOS transistor structure, said fourth region being located within said third region;

a fifth region formed in said semiconductor material, said fifth region being of said first conductivity type and having a sixth dopant concentration to form a contact enhancement region of said RF MOS transistor structure, said sixth dopant concentration being greater than said fourth dopant concentration of said third region, said fifth region being located within said third region; and a conductive plug region formed in said source region and said body region of said semiconductor material;

wherein a remaining portion of said epitaxial layer underlying said second gate region is of said first conductivity type; and wherein said enhanced drain drift region and said channel region are separated by said remaining portion of said epitaxial layer.

2. A lateral RF MOS transistor having a quasi-mesh gate structure comprising:

a semiconductor material of a first conductivity type, said semiconductor material having a first dopant concentration and a top surface;

a plurality of conductive gates, each said gate overlying and being insulated from said top surface of said semiconductor material, each said gate further comprising:
a first gate region;
a second gate region; and
a third gate region;

a plurality of first regions formed completely within said semiconductor material of said first conductivity type, said first regions being of a second conductivity type and a second dopant concentration to form substantially identical enhanced drain drift regions of said lateral RF MOS transistor, each said first region underlying one said first gate region;

a plurality of second regions formed in said semiconductor material, said second regions being of said second conductivity type and a third dopant concentration greater than said second dopant concentration to form substantially identical drain regions of said lateral RF MOS transistor, wherein each of said second regions contacts a respective one of said first regions, a plurality of third regions formed in said semiconductor material, said third regions being of said first conductivity type and a fourth dopant concentration to form substantially identical body regions of said lateral RF MOS transistor, said fourth dopant concentration being equal or greater than said first dopant concentration, each said body region further including:
a channel region formed in said body region when a voltage is applied to said RF MOS device, said channel region underlying one said third gate region; wherein a remaining portion of said epitaxial layer underlying each said second gate region is of said first conductivity type; and wherein each said enhanced drain drift region and each said channel region are separated by said remaining portion of said epitaxial layer;

a plurality of fourth regions formed in said semiconductor material, each of said fourth regions being of said second conductivity type and a fifth dopant concentration to form substantially identical source regions of said lateral RF MOS transistor, each of said fourth regions located within a respective one of said third regions;

a plurality of fifth regions formed in said semiconductor material, each of said fifth regions being of said first conductivity type and a sixth dopant concentration to form substantially identical body contact enhancement regions of said lateral RF MOS transistor, said sixth dopant concentration being greater than said fourth dopant concentration, each of said fifth regions being located within a respective one of said third regions;

a plurality of conductive plug regions, each said conductive plug region being formed in a respective one of said source regions and said body regions, each said conductive plug region being used to connect one said source region and one said body region of said semiconductor material to a backside of said lateral RF MOS transistor;

a layer of an insulator covering said top surface of said semiconductor material, said insulator layer including a first plurality of openings and a second plurality of openings; said first plurality of openings used to expose each said gate region; said second plurality of openings used to expose each said drain region;

a first plurality of metal fingers used to connect each said exposed drain region to a first side of said RF MOS transistor; and a second plurality of metal fingers used to connect each said exposed gate region to a second side of said RF MOS transistor.

3. The semiconductor device of claim 1, wherein said first conductivity type is a P type.

4. The semiconductor device of claim 1, wherein said first conductivity type is an N type.

5. The semiconductor device of claim 1, wherein:

each said drain region is more heavily doped than each said enhanced drift drain region.

6. The semiconductor device of claim 1, wherein:

each said body region is more heavily doped than said epitaxial layer.

7. The semiconductor device of claim 1, wherein:

each said drain region and each said source region are equally doped.

* * * * *